United States Patent [19]
Nitta

[11] Patent Number: 5,157,544
[45] Date of Patent: Oct. 20, 1992

[54] WAVEGUIDE OPTICAL ELEMENT AND ITS DRIVING METHOD

[75] Inventor: Jun Nitta, Sagamihara, Japan

[73] Assignee: Canon Kabushiki Kaisha, Tokyo, Japan

[21] Appl. No.: 659,278

[22] Filed: Feb. 22, 1991

[30] Foreign Application Priority Data

Feb. 27, 1990 [JP] Japan .................................. 2-046586

[51] Int. Cl.⁵ ............................. G02R 6/34; H01S 3/19
[52] U.S. Cl. .................................. 359/344; 359/337; 357/30; 272/46; 272/49
[58] Field of Search ............... 359/239, 337, 344; 357/17, 30; 372/46, 49

[56] References Cited

U.S. PATENT DOCUMENTS

| | | | |
|---|---|---|---|
| 4,525,687 | 6/1985 | Chemla et al. | 357/17 |
| 4,743,087 | 5/1988 | Utaka et al. | 372/49 |
| 4,904,045 | 2/1990 | Alferness et al. | 372/45 |
| 4,942,366 | 7/1990 | Toda | 359/344 |
| 4,961,197 | 10/1990 | Tanaka et al. | 372/46 |
| 5,004,325 | 4/1991 | Glass et al. | 350/334 |
| 5,016,990 | 5/1991 | Dobson | 359/337 |

FOREIGN PATENT DOCUMENTS 2237654 5/1991 United Kingdom.

OTHER PUBLICATIONS

Pamulapate et al.; "Electro-Optic Effect . . . Resonances"; Superlattices Microstruct. vol. 8, #3, pp. 317–321, 1990.

Zucker et al.; "Electrorefraction . . . Heterostructures"; Electr. Lett., vol. 24, #8, pp. 458–460, Apr. 14, 1988.

*Primary Examiner*—Nelson Moskowitz
*Attorney, Agent, or Firm*—Fitzpatrick, Cella, Harper & Scinto

[57] ABSTRACT

A waveguide optical element includes a waveguide layer which is formed on a substrate, through which light propagates and which has an end face from which the propagation light becomes incident on the waveguide layer or emerges, a thin film formed on the end face of the waveguide layer, for increasing or decreasing a reflectance of light at end face, and control means having an electrode formed on a portion of the waveguide layer, for controlling a refractive index of the portion of the waveguide layer, which portion is in contact with the thin film. And its driving method is provided.

32 Claims, 4 Drawing Sheets

WAVEGUIDE OPTICAL ELEMENT AND ITS DRIVING METHOD

BACKGROUND OF THE INVENTION

1. Field of the Invention

The present invention relates to a waveguide optical element in which a thin film such as an antireflection film or a high-reflectance film is formed at an end face of a waveguide and its driving method and, more particularly, to a waveguide optical element used as an optical amplifier in, e.g., an optical communication system, and its driving method.

2. Related Background Art

A conventional travelling wave type laser amplifier is formed in such a manner that a semiconductor active layer serving as a waveguide is formed on a substrate, and an electrode for injecting a current to the active layer is arranged. In this amplifier, the two end faces of the active layer are cleavaged to constitute a Fabry-Pérot resonator.

When the amplifier is to be driven, a current equal to or lower than a threshold value, i.e., a current value for causing the amplifier itself to emit light is injected from the electrode to the active layer. Light is caused to be incident from one end face. The incident light is amplified by induced emission in the active layer, and emerges from the other end face.

In order to increase a gain of such a laser amplifier, it is known to form an antireflection film on the end face of the resonator. When an antireflection film is formed in this manner, the above-mentioned threshold value current is increased, and the density of carriers capable of being injected into the active layer can be increased. When the carrier density in the active layer is increased, a gain of light incident on the amplifier can be increased accordingly. The Fabry-Pérot resonator has very severe wavelength selectivity in its light transmission characteristics. The antireflection film also has an effect of reducing the wavelength selectivity, and widening a wavelength range of light which can be used for the amplifier.

However, in the conventional amplifier, the refractive index, the film thickness, and the like of the antireflection film are determined to obtain a maximum antireflection effect against light having a predetermined wavelength at a predetermined temperature. For this reason, the conventional amplifier cannot obtain a sufficient gain when the wavelength of light to be actually used is different from the predetermined wavelength, or when a temperature during an operation is changed. The same problems are posed not only in the amplifier described above, but also in a laser diode in which a high-reflectance film is formed on an end face of a resonator.

SUMMARY OF THE INVENTION

It is an object of the present invention to provide a waveguide optical element which can solve the conventional problems, and can satisfactorily provide its function even when the wavelength of light to be used or the temperature in use is changed, and its driving method.

In order to achieve the above object, there is provided a waveguide optical element comprising:

a substrate;

a waveguide layer which is formed on the substrate, and through which light propagates, the waveguide layer having an end face from which the propagation light becomes incident on the waveguide layer, or emerges;

a thin film, formed on the end face of the waveguide layer, for increasing or decreasing a reflectance of light at the end face; and control means for controlling a refractive index of a portion of the waveguide layer, which portion is in contact with the thin film.

There is also provided a semiconductor optical amplifier according to the present invention, comprising:

a substrate;

a semiconductor waveguide layer which is formed on the substrate, and through which light propagates, the waveguide layer having a pair of end faces constituting a laser resonator;

amplifier means for injecting a current into the waveguide layer to amplify the propagation light;

antireflection films formed on the two end faces of the waveguide layer; and control means for controlling refractive indices of portions of the waveguide layer, which portions are in contact with the antireflection films.

There is also provided a method of driving the semiconductor optical amplifier, comprising the steps of:

inputting light from one end face of the waveguide layer;

causing the amplifier means to inject a current into the waveguide layer so as to amplify the input light;

detecting the amplified light emerging from the other end face of the waveguide layer; and causing the control means to control refractive indices of the portions of the waveguide layer, which portions contact the antireflection films, in accordance with an intensity of the detected light.

DETAILED DESCRIPTION OF THE PREFERRED EMBODIMENTS

Figure 1:
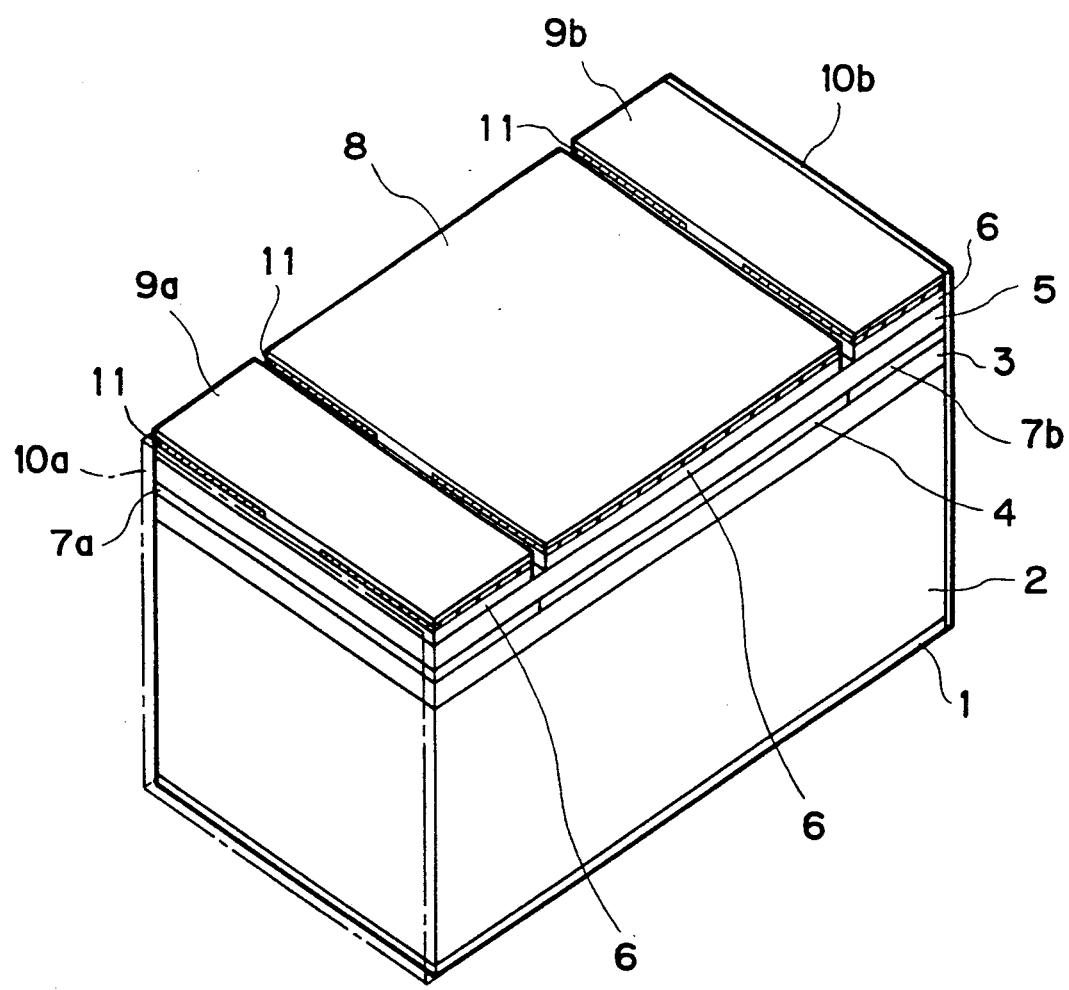
FIG. 1 is a schematic perspective view showing a semiconductor optical amplifier according to the first embodiment of the present invention.

FIG. 1 is a schematic perspective view showing the first embodiment in which the present invention is applied to a semiconductor optical amplifier. In FIG. 1, the optical amplifier comprises a first electrode 1 formed of, e.g., an alloy of gold (Au) and germanium (Ge), a substrate 2 formed of, e.g., an n-type GaAs layer, a first (lower) cladding layer 3 formed of, e.g., an n-type $Al_{0.3}Ga_{0.7}As$ layer, an active layer 4 formed of, e.g., a non-doped GaAs layer, a second (upper) cladding layer 5 formed of, e.g., a p-type $Al_{0.3}Ga_{0.7}As$ layer, a capping layer 6 formed of, e.g., a p-type GaAs layer, window waveguide layers 7a and 7b which are located on two sides of the active layer 4 with respect to a light propagation direction, and are formed of, e.g., non-doped $Al_{0.1}Ga_{0.9}As$ layers, a second electrode 8, formed of, e.g., an alloy of gold (Au) and chromium (Cr), for injecting a current to the active layer 4, third and fourth electrodes 9a and 9b, formed of, e.g., an alloy of gold (Au) and chromium (Cr), for injecting a current to the window waveguide layers 7a and 7b, respectively, antireflection films 10a and 10b formed of, e.g., an insulating material on the two end faces, and an insulating film 11 formed of, e.g., an $SiO_2$ layer. The active layer 4 and the window waveguide layers 7a and 7b constitute a light waveguide layer for transmitting light as a whole. The two end faces, where the antireflection films 10a and 10b are formed, of the light waveguide layer serve as resonance surfaces, thus constituting a Fabry-Pérot resonator. In a stripe-shaped portion extending along a light propagation direction, the second, third, and fourth electrodes 8, 9a, and 9b are in ohmic-contact with the capping layer. The stripe-shaped portion serves as an effective region of the amplifier.

The operation of the first embodiment with the above-mentioned structure will be described below.

The semiconductor optical amplifier is a so-called travelling wave type laser amplifier in which externally input light propagates through the effective region of the waveguide layer (the central portions of the window waveguide layer 7a, the active layer 4, and the window waveguide layer 7b), is amplified by induced emission when it passes through the active layer 4, and is output from the waveguide layer. Therefore, the antireflection films 10a and 10b are formed on the surface for receiving externally input light, and the surface for outputting light outside the amplifier, as described above. The refractive indices of waveguide portions contacting the antireflection films 10a and 10b, i.e., the window waveguide layers 7a and 7b are electrically controlled, so that reflectances of the antireflection films 10a and 10b are lower than the wavelength of input light or a peak wavelength in a gain spectrum of the active layer 4. For this purpose, according to this embodiment, a carrier is injected into the window waveguide layers 7a and 7b via the first, third, and fourth electrodes 1, 9a, and 9b, thereby changing equivalent refractive indices of the window waveguide layers 7a and 7b by a plasma effect. Thus, an injection current amount can be controlled so that the reflectances of the antireflection films 10a and 10b are lower than the input light wavelength.

In order to operate the amplifier of this embodiment as a travelling wave type laser amplifier, a current is injected from the first and second electrodes 1 and 8 into the active layer 4 to cause induced emission in the active layer 4. At this time, the injected current flows only through the effective region at the central portion of the active layer 4 due to the presence of the insulating film 11. Of course, a current injection amount at this time is set to be equal to or lower than a current threshold value of laser oscillation. Note that the antireflection films 10a and 10b do not perfectly inhibit reflection of light at the end faces, and the end faces cause slight reflection. Thus, the amplifier has a current threshold value of laser oscillation corresponding to the reflection at the end faces.

On the other hand, a current is injected into the window waveguide layers 7a and 7b via the first, third, and fourth electrodes 1, 9a, and 9b, and the refractive indices of the layers 7a and 7b are changed by the plasma effect.

In this manner, the reflectances of the end faces where the antireflection films 10a and 10b are formed can be decreased as much as possible with respect to a desired wavelength. Thus, a current amount capable of being injected into the effective region of the active layer 4 can be increased, and a larger gain than that of the conventional amplifier can be obtained.

Figure 2:
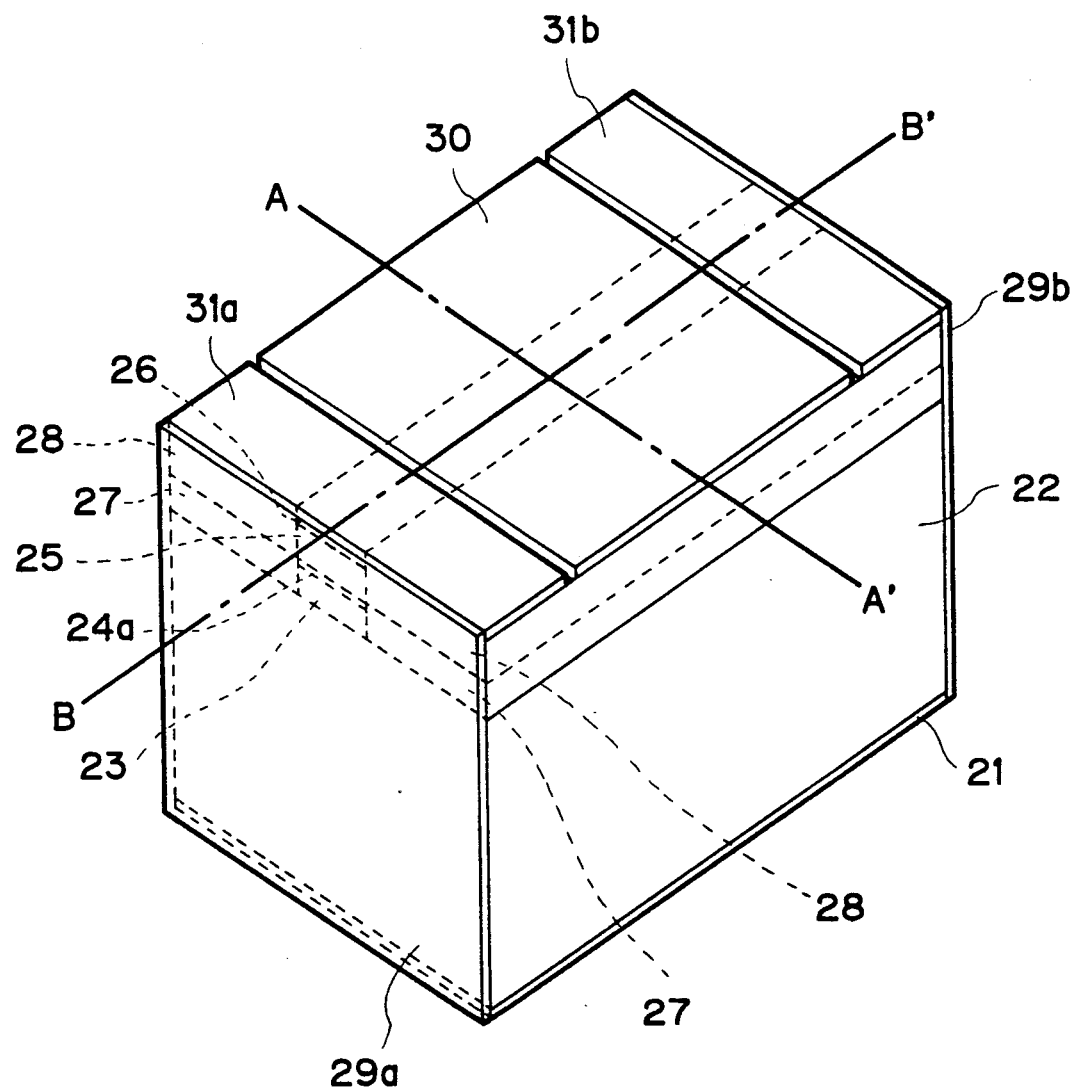
FIG. 2 is a schematic perspective view showing a semiconductor optical amplifier according to the second embodiment of the present invention.
Figure 3:
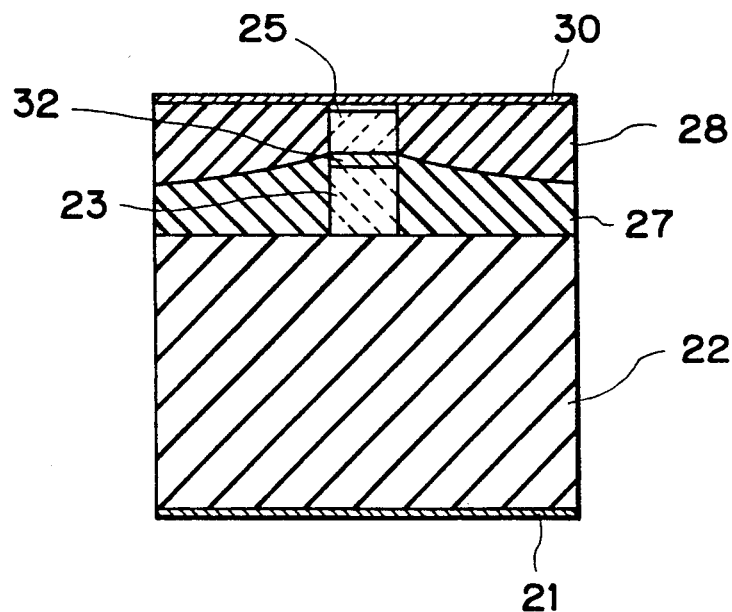
FIG. 3 is a schematic sectional view of the second embodiment taken along a direction perpendicular to a resonance direction.
Figure 4:
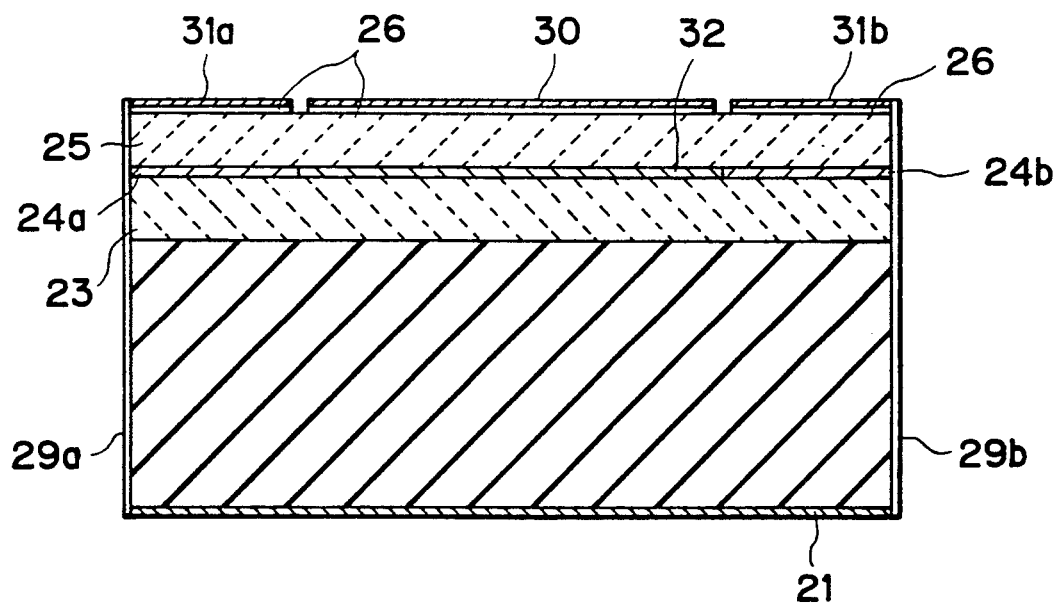
FIG. 4 is a schematic sectional view of the second embodiment taken along the resonance direction.

FIG. 2 is a schematic perspective view showing the second embodiment in which the present invention is applied to a semiconductor optical amplifier. FIG. 3 is a schematic sectional view of the second embodiment taken along a direction perpendicular to a resonance direction, as indicated by a line segment A-A' in FIG. 2. FIG. 4 is a schematic sectional view of the second embodiment taken along the resonance direction, as indicated by a line segment B-B' in FIG. 2.

In FIGS. 2 to 4, the amplifier comprises a first electrode 21 formed of, e.g., an alloy of gold and germanium, a substrate 22 formed of, e.g., an n-type GaAs layer, a first cladding layer 23 formed of, e.g., a 2-μm thick n-type $Al_{0.3}Ga_{0.7}As$ layer, quantum well structure (QWS) layers 24a and 24b obtained by alternately stacking, e.g., two sets of 100-Å thick GaAs well layers and 200-Å thick $Al_{0.2}Ga_{0.8}As$ barrier layers, a second cladding layer 25 formed of, e.g., a 2-μm thick p-type $Al_{0.3}Ga_{0.7}As$ layer, a capping layer 26 formed of a 0.1-μm thick p-type GaAs layer, a first buried layer 27 which is formed of, e.g., a p-type $Al_{0.4}Ga_{0.6}As$ layer, and has a thickness from the substrate 22 to the QWS layers 24a and 24b, a second buried layer 28 formed of, e.g., an n-type $Al_{0.4}Ga_{0.6}As$ layer on the first buried layer 27, antireflection films 29a and 29b formed at the two end faces of the amplifier, a second electrode 30, formed of, e.g., an alloy of gold and chromium, for injecting a current into an active region, and third and fourth electrodes 31a and 31b, formed of, e.g., an alloy of gold and chromium, for applying reverse bias voltages to the QWS layers 24a and 24b near the two end faces, respectively.

As shown in FIGS. 3 and 4, an active layer 32 formed of, e.g., a 0.1-μm thick non-doped GaAs layer is formed between the QWS layers 24a and 24b on two sides to be sandwiched between the first and second cladding layers 23 and 25.

The refractive indices of the QWS layers 24a and 24b on two sides of the active layer 32 are changed by a quantum confinement Stark effect (QCSE) upon application of the reverse bias voltages from the first, third, and fourth electrodes 21, 31a, and 31b. This is because electron levels of subbands of the well layers in the QWS layers are shifted upon application of the voltage. When the refractive indices of the QWS layers are changed in this manner, the reflectances of the end faces where the antireflection films 29a and 29b are formed can also be changed. Therefore, according to the second embodiment, electric fields to be applied to the QWS layers 24a and 24b are adjusted, so that the reflectances of the end faces are lowered as much as possible with respect to a wavelength of light to be used, thus obtaining a large gain like in the first embodiment.

The basic operation of the second embodiment is substantially the same as that of the first embodiment, except that the lateral confinement of light is performed in the buried layers 27 and 28.

In the above embodiments, the refractive indices of the light waveguide portions near the antireflection films are changed by using the plasma effect or the QCSE, so that the reflectances of the antireflection films can be lowered with respect to a desired wavelength than those of such films which are simply formed on the end faces. In place of these effects, other effects, e.g., a Franz-Keldysh effect, may be used.

An application of the optical amplifier described above will be described below.

Figure 5:
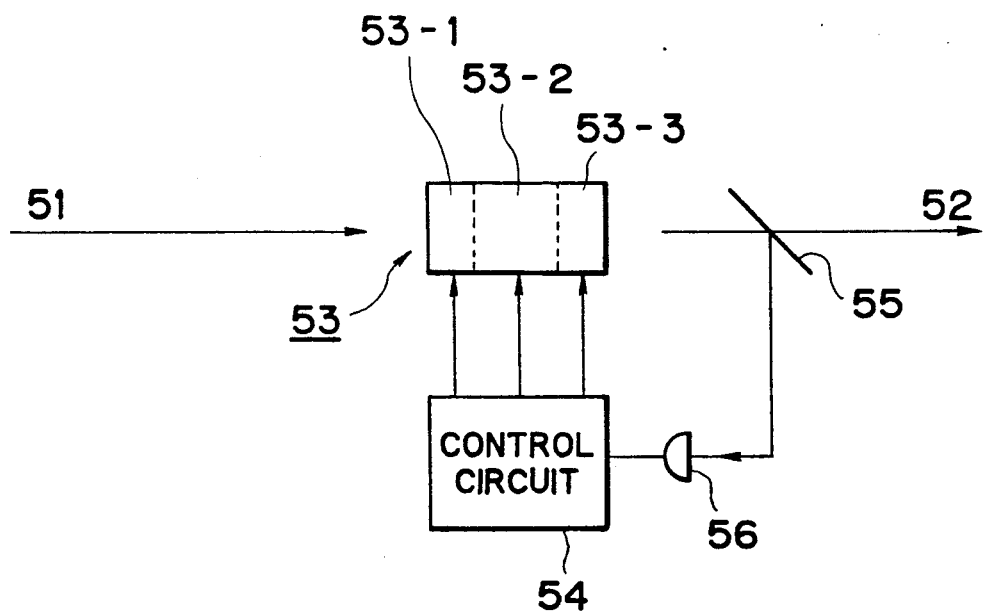
FIG. 5 is a schematic diagram of a repeater of an optical communication system using the semiconductor optical amplifier of the present invention.

FIG. 5 shows an application example. In FIG. 5, reference numeral 51 designates an input signal, and reference numeral 52 designates an output signal. A semiconductor optical amplifier 53 according to the present invention comprises refractive index control sections 53-1 and 53-3, and an amplifier section 53-2.

The optical amplifier 53 has a structure described above with reference to FIG. 1 or FIGS. 2 to 4.

The amplifier 53 is connected to a control circuit 54 for controlling the optical amplifier 53, a beam sampler 55 for extracting some components of the output signal light 52, and a photodetector 56 for detecting the components of the output signal light 52 extracted by the beam sampler 55.

The control circuit 54 controls the refractive index control sections 53-1 and 53-3, and the amplifier section 53-2 of the semiconductor optical amplifier 53.

The arrangement shown in FIG. 5 can be used as a repeater in an optical communication system. The operation of the optical amplifier 53 in this case is as follows.

Prior to input of the input signal light 51, light which has the same wavelength as that of the signal light 51 and is modulated at a frequency $\omega_2$ (adjustment signal light) is input to the semiconductor optical amplifier 53. Assume that a current modulated at a frequency $\omega_1$ is injected into the amplifier section 53-2 of the amplifier 53. In this state, when the adjustment signal light is input to the amplifier 53, it is amplified by the amplifier section 53-2, and is output as the output signal light 52.

Some components of the output signal light 52 are separated by the beam sampler 55, and are input to the photodetector 56. The output signal from the photodetector 56 is input to the control circuit 54, and is separated into a signal component corresponding to a light intensity of light which has the frequency $\omega_1$ and is emitted from the amplifier 53 itself (signal $S_1$), and a signal component corresponding to the amplified adjustment signal light having the frequency $\omega_2$ (signal $S_2$). The control circuit 54 changes the refractive indices of the refractive index control sections 53-1 and 53-3 on the basis of these separated signals $S_1$ and $S_2$, and controls to maximize the intensity of the amplified light without largely increasing light emitted from the amplifier 53 itself, i.e., without causing laser oscillation of the amplifier 53. In order to change the refractive indices of the refractive index control sections 53-1 and 53-3, when the first embodiment is adopted as the amplifier 53, a current to be injected into these control sections is changed. On the other hand, when the second embodiment is adopted as the amplifier 53, a voltage to be applied to the control sections 53-1 and 53-3 is changed.

Under the above-mentioned control, the semiconductor optical amplifier 53 can always provide a maximum gain corresponding to the current injected into the amplifier section 53-2.

In FIG. 5, light propagates in only one direction. However, the present invention can be applied to an arrangement in which light is input from two directions. If the input signal light 51 is separated by the beam sampler and the separated components are input to the control circuit 54, the gain can also be controlled.

Various other applications of the present invention may be made in addition to the embodiments described above. For example, the present invention may be applied to a laser diode in which high-reflectance films are formed at end faces of a resonator in addition to the optical amplifier. In this case, waveguide portions whose refractive indices are adjusted are arranged near laser resonance surfaces where the high-reflectance films are formed. When the refractive indices of the adjustment portions are controlled, the reflectances at the resonance surfaces can be maximized. The present invention includes such applications as long as they do not depart from the scope of claims.

What is claimed is:

1. A waveguide optical element comprising:
   a substrate;
   a waveguide layer which is formed on said substrate, and through which light propagates, said waveguide layer having an end face from which the propagation light becomes incident on said waveguide layer, or emerges;
   a thin film, formed on the end face of said waveguide layer, for increasing or decreasing a reflectance of light at the end face; and
   control means for changing a refractive index of a portion of said waveguide layer, which portion is contiguous with said thin film to vary a reflectance of light at the end face of said waveguide layer.

2. An element according to claim 1, wherein said control means comprises an electrode formed on the portion of said waveguide layer, which portion is contiguous with said thin film.

3. An element according to claim 1, further comprising:
   a first cladding layer formed between said substrate and said waveguide layer; and
   a second cladding layer formed to be contiguous with a surface of said waveguide layer, which surface is opposite to a surface thereof facing said first cladding layer.

4. A semiconductor optical amplifier comprising:
   a substrate;
   a semiconductor waveguide layer which is formed on said substrate, and through which light propagates, said waveguide layer having a pair of end faces constituting a laser resonator;
   amplifier means for injecting a current into said waveguide layer to amplify the propagation light;
   antireflection films formed on the two end faces of said waveguide layer; and
   control means for changing refractive indices of portions of said waveguide layer, which portions are contiguous with said antireflection films to vary a reflectance of light at the end faces of said waveguide layer.

5. An amplifier according to claim 4, wherein said control means comprises first electrodes formed on the portions of said waveguide layers, which portions are contiguous with said antireflection films.

6. An amplifier according to claim 5, wherein said amplifier means comprises a second electrode formed on a portion, other than the portions contacting said antireflection films, of said waveguide layer independently of said first electrodes.

7. An amplifier according to claim 6, further comprising an insulating film for restricting a region where said first and second electrodes electrically contact said waveguide layer to a stripe-shaped region extending in a resonance direction of said resonator.

8. An amplifier according to claim 4, wherein said waveguide layer is formed into a stripe pattern extending in a resonance direction of said resonator on a portion of said substrate, and a buried layer is formed on the remaining portion of said substrate.

9. An amplifier according to claim 4, further comprising:
a first cladding layer formed between said substrate and said waveguide layer; and
a second cladding layer formed to be contiguous a surface of said waveguide layer, which surface is opposite to a surface thereof facing said first cladding layer.

10. An amplifier according to claim 9, wherein said first cladding layer comprises an n-type semiconductor, said second cladding layer comprises a p-type semiconductor, and said waveguide layer comprises a non-doped semiconductor.

11. A method of driving a semiconductor optical amplifier which comprises a substrate, a semiconductor waveguide layer which is formed on said substrate, and through which light propagates, said waveguide layer having a pair of end faces constituting a laser resonator, amplifier means for injecting a current into said waveguide layer to amplify the propagation light, antireflection films formed on the two end faces of said waveguide layer, and control means for controlling refractive indices of portions,. of said waveguide layer, which portions are contiguous with said antireflection films, comprising the steps of:
inputting light from one end face of said waveguide layer;
causing said amplifier means to inject a current into said waveguide layer so as to amplify the input light;
detecting the amplified light emerging from the other end face of said waveguide layer; and
causing said control means to control refractive indices of the portions of said waveguide layer, which portions are contiguous with said antireflection films, in accordance with an intensity of the detected light.

12. A method according to claim 11, wherein said control means controls the refractive indices of the portions of said waveguide layer, which portions are contiguous with said antireflection films, so as to maximize an intensity of the amplified light without an intensity of a light component emitted from said optical amplifier itself of the detected light.

13. A method according to claim 11, wherein said control means controls the refractive indices by injecting a current into the portions of said waveguide layer, which portions are contiguous with said antireflection films.

14. A method according to claim 11, wherein the portions of said waveguide layer, which portions are contiguous with said antireflection films have a quantum well structure, and said control means applies a voltage to the portions to control the refractive indices thereof.

15. A method of driving a semiconductor optical amplifier which comprises a substrate, a semiconductor waveguide layer which is formed on said substrate, and through which light propagates, said waveguide layer having a pair of end faces constituting a laser resonator, amplifier means for injecting a current into said waveguide layer to amplify the propagation light, antireflection films formed on the two end faces of said waveguide layer, and control means for controlling refractive indices of portions of said waveguide layer, which portions are contiguous with said antireflection films, comprising the steps of:
inputting light modulated at a first frequency from one end face of said waveguide layer;
causing said amplifier means to inject a current modulated at a second frequency into said waveguide layer so as to amplify the input light;
detecting the amplified light emerging from the other end face of said waveguide layer as an electrical signal;
separating the detected electrical signal into a first signal component having the first frequency, and a second signal component having the second frequency; and
causing said control means to control refractive indices of the portions of said waveguide layer, which portions are contiguous with said antireflection films, so as to maximize the first signal component without increasing the second signal component of the separated signal components.

16. A method according to claim 15, wherein said control means controls the refractive indices by injecting a current into the portions of said waveguide layer, which portions are contiguous with said antireflection films.

17. A method according to claim 15, wherein the portions of said waveguide layer, which portions are contiguous with said antireflection films have a quantum well structure, and said control means applies a voltage to the portions to control the refractive indices thereof.

18. An optical amplifier apparatus comprising:
a semiconductor optical amplifier, which comprises
a substrate,
a semiconductor waveguide layer which is formed on said substrate, and through which light propagates, said waveguide layer having a pair of end faces constituting a laser resonator,
amplifier means for injecting a current into said waveguide layer to amplify the propagation light,
antireflection films formed on the two end faces of said waveguide layer, and
control means for controlling refractive indices of portions of said waveguide layer, which portions are contiguous with said antireflection films;
a photodetector for detecting some components of the light amplified by said optical amplifier; and
a control circuit for driving said control means of said optical amplifier in accordance with an output from said photodetector.

19. An apparatus according to claim 18, wherein said control means of said optical amplifier comprises first electrodes formed on the portions of said waveguide layers, which portions are contiguous with said antireflection films.

20. An apparatus according to claim 19, wherein said amplifier means of said optical amplifier comprises a second electrode formed on a portion, other than the portions contiguous with said antireflection films, of said waveguide layer independently of said first electrodes.

21. An apparatus according to claim 20, wherein said optical amplifier further comprises an insulating film for restricting a region where said first and second electrodes electrically contact said waveguide layer to a stripe-shaped region extending in a resonance direction of said resonator.

22. An apparatus according to claim 18, wherein said waveguide layer is formed into a stripe pattern extending in a resonance direction of said resonator on a portion of said substrate, and a buried layer is formed on the remaining portion of said substrate.

23. An apparatus according to claim 18, wherein said optical amplifier further comprises:
   a first cladding layer formed between said substrate and said waveguide layer; and
   a second cladding layer formed to be contiguous with a surface of said waveguide layer, which surface is opposite to a surface thereof facing said first cladding layer.

24. An apparatus according to claim 23, wherein said first cladding layer comprises an n-type semiconductor, said second cladding layer comprises a p-type semiconductor, and said waveguide layer comprises a non-doped semiconductor.

25. A semiconductor optical amplifier comprising:
   a substrate;
   a semiconductor waveguide layer which is formed on said substrate, and through which light propagates, said waveguide layer having a pair of end faces constituting a laser resonator, refractive index control portions contiguous with the end faces, and an active portion;
   antireflection films formed on the two end faces of said waveguide layer;
   a first electrode, formed on said active portion of said waveguide layer, for injecting a current into said active portion to amplify the propagation light; and
   second electrodes, formed on said refractive index control portions of said waveguide layer, for changing refractive indices of said refractive index control portions to vary a reflectance of light at the end of faces.

26. An amplifier according to claim 25, further comprising an insulating film for restricting a region where said first and second electrodes electrically contact said waveguide layer to a stripe-shaped region extending in a resonance direction of said resonator.

27. An amplifier according to claim 25, wherein said waveguide layer is formed into a stripe pattern extending in a resonance direction of said resonator on a portion of said substrate, and a buried layer is formed on the remaining portion of said substrate.

28. An amplifier according to claim 25, further comprising:
   a first cladding layer formed between said substrate and said waveguide layer; and
   a second cladding layer formed to be in contact with a surface of said waveguide layer, which surface is opposite to a surface thereof facing said first cladding layer.

29. An amplifier according to claim 28, wherein said first cladding layer comprises an n-type semiconductor, said second cladding layer comprises a p-type semiconductor, and said waveguide layer comprises a non-doped semiconductor.

30. An amplifier according to claim 25, wherein each of said refractive index control portions of said waveguide layer comprises a quantum well structure obtained by alternately stacking well layers and barrier layers.

31. An amplifier according to claim 30, wherein said well layers and said active portion of said waveguide layer are formed of GaAs, and said barrier layers are formed of AlGaAs.

32. An amplifier according to claim 25, wherein said active portion of said waveguide layer is formed of GaAs, and said refractive index control portions of said waveguide layer are formed of AlGaAs.

* * * * *

UNITED STATES PATENT AND TRADEMARK OFFICE
CERTIFICATE OF CORRECTION

PATENT NO. : 5,157,544
DATED : October 20, 1992
INVENTOR(S) : Nitta

It is certified that error appears in the above-identified patent and that said Letters Patent is hereby corrected as shown below:

COLUMN 2:

Line 64, "$Al_{0.3}Ga_{0.7}S$ layer," should read --$Al_{0.3}Ga_{0.7}As$ layer,--.

COLUMN 5:

Line 67, "sampler" should read --sampler 55--.

COLUMN 7:

Line 12, "contiguous" should read --contiguous with--;
  Line 30, "portions,." should read --portions--; and
  Line 49, "without an" should read --without increasing an--.

Signed and Sealed this

Second Day of November, 1993

Attest:

BRUCE LEHMAN

*Attesting Officer*   Commissioner of Patents and Trademarks